United States Patent
Lien et al.

(10) Patent No.: US 6,876,027 B2
(45) Date of Patent: Apr. 5, 2005

(54) METHOD OF FORMING A METAL-INSULATOR-METAL CAPACITOR STRUCTURE IN A COPPER DAMASCENE PROCESS SEQUENCE

(75) Inventors: Wan-Yih Lien, Hsin-chu (TW); Chii-Ming M. Wu, Hsin-chu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 117 days.

(21) Appl. No.: 10/411,346

(22) Filed: Apr. 10, 2003

(65) Prior Publication Data

US 2004/0201057 A1 Oct. 14, 2004

(51) Int. Cl.$^7$ ............................................. H01L 27/108
(52) U.S. Cl. ...................... 257/306; 257/532; 257/310; 438/250; 438/393
(58) Field of Search ................. 458/250, 393; 257/306, 532, 310, 311, 303, 298

(56) References Cited

U.S. PATENT DOCUMENTS

| | | | |
|---|---|---|---|
| 5,946,567 A | 8/1999 | Weng et al. ................. | 438/250 |
| 6,001,702 A | 12/1999 | Cook et al. .................. | 438/393 |
| 6,313,003 B1 | 11/2001 | Chen ........................... | 438/396 |
| 6,387,775 B1 | 5/2002 | Jang et al. ................... | 438/396 |
| 6,583,491 B1 * | 6/2003 | Huang et al. ............... | 257/532 |
| 6,734,079 B2 * | 5/2004 | Huang et al. ............... | 438/396 |

* cited by examiner

Primary Examiner—Jack Chen
(74) Attorney, Agent, or Firm—Thomas, Kayden, Horstemeyer & Risley

(57) ABSTRACT

A method of forming a metal-oxide-metal (MIM), capacitor structure wherein the fabrication procedures used for the MIM capacitor structure are integrated into a process sequence used to form damascene type copper interconnect structures for CMOS type devices, has been developed. The process sequence features a copper damascene connector located overlying exposed portions of a semiconductor substrate, and underlying the MIM capacitor structure. The MIM capacitor structure, comprised a capacitor dielectric layer sandwiched between conductive capacitor plates, is protected during several selective reactive ion etching patterning procedures by an overlying anti-reflective coating (ARC), insulator shape, and by insulator spacers located on the sides of the ARC shape and on the sides of a capacitor dielectric shape. The presence of the insulator shape protects the MIM capacitor structure during a subsequent process used to define another copper damascene connector structure, overlying and contacting the MIM capacitor structure.

8 Claims, 4 Drawing Sheets

METHOD OF FORMING A METAL-INSULATOR-METAL CAPACITOR STRUCTURE IN A COPPER DAMASCENE PROCESS SEQUENCE

BACKGROUND OF THE INVENTION (1) Field of the Invention

The present invention relates to methods used to fabricate semiconductor devices, and more specifically to a method used to fabricate a metal-insulator-metal (MIM), capacitor structure as part of a process sequence used to also form copper damascene interconnect structures.

(2) Description of Prior Art

Capacitor structures exhibiting high reliability as well as low defect density, for use in high performance mixed signal and RF circuits, are formed via processes integrated with the processes used to fabricate complimentary metal oxide semiconductor (CMOS), devices. Metal-insulator-metal (MIM), capacitors are usually formed either before, simultaneously, or after, formation of copper interconnect structures, defined via damascene procedures. However several process issues encountered with copper damascene processing can adversely influence the yield and reliability of the MIM structures, formed during a copper damascene process sequence. First, the low dielectric constant (low k), materials used as intermetal dielectric (IMD), layers sometimes formed of polymer layers featuring poor dielectric quality, located surrounding copper damascene or MIM capacitor structures, can present unwanted leakage paths for the adjacent capacitor structures. Secondly, MIM capacitor structures formed directly as damascene structures have the top surface of the metal plate exposed to subsequent processing sequences, such as chemical mechanical polishing (CMP), procedures, which can result in a damaged MIM capacitor structure. In addition exposed edges of already defined MIM capacitor structures can be damaged during subsequent copper damascene fabrication procedures.

The present invention will describe a method of forming a MIM capacitor structure in a copper damascene process sequence, in which leaky structures resulting from etching of adjacent low k, IMD layers, or from etching of surrounding polymer layer, is eliminated. The present invention will also describe a method of forming an MIM capacitor structure in which the edges of the MIM capacitor structure are not damaged, nor is the top plate of the capacitor structure exposed, during subsequent process sequences. Prior art such as Jang et al, in U.S. Pat. No. 6,387,775 B1, Cook et al, in U.S. Pat. No. 6,001,702, Weng et al, in U.S. Pat. No. 5,946,567, and Chen, in U.S. Pat. No. 6,313,003 B1, describe methods of forming capacitor structures, as well as forming a capacitor structure using a damascene process. However none of these prior art describe the novel procedure used in this present invention wherein a MIM capacitor structure is successfully integrated into a copper damascene process sequence, featuring protection of specific elements of the MIM capacitor structure during subsequent copper damascene processing.

SUMMARY OF THE INVENTION

It is an object of this invention to integrate a process of fabricating an metal-insulator-metal (MIM), capacitor structure with processes used to fabricate copper damascene structures.

It is another object of this invention to protect the top metal plate of the MIM capacitor structure during definition of the capacitor structure, or during subsequent damascene procedures.

It is still another object of this invention to form insulator spacers on the sides of the MIM capacitor structure to eliminate leaky capacitor structures, as well as to eliminate damage of capacitor structure edges, during the final stages of MIM capacitor structure fabrication, and during subsequent copper damascene procedures.

In accordance with the present invention a method of integrating the formation of a MIM capacitor structure with procedures used to form damascene type, copper interconnect structures used as components of CMOS type devices, is described. A damascene copper structure, used as a bottom plate connector structure for the MIM capacitor structure, is defined in an opening in an intermetallic dielectric (IMD), layer, overlying and contacting elements on, or in, an underlying semiconductor substrate. An MIM stack comprised of an underlying conductive layer, a dielectric layer, an overlying conductive layer, and a anti-reflective coating (ARC), layer, is deposited overlying the bottom plate connector structure. Photolithographic and a first selective dry etching procedure are employed to define an ARC shape in the ARC layer, as well as defining a capacitor top plate shape in the overlying conductive layer. Insulator spacers are then formed on the sides of the ARC shape and on the sides of the capacitor top plate structure using a second selective dry etch procedure for spacer definition, with the second selective dry etch procedure also resulting in patterning of the underlying dielectric layer, defining a capacitor dielectric shape. A third selective dry etch procedure is then used for patterning of the underlying conductive layer, using the ARC shape and the insulator spacers as an etch mask, defining a capacitor bottom plate structure. Photolithographic and dry etching procedures are then employed to define an opening in an overlying IMD layer and in the ARC shape exposing a portion of the top surface of the capacitor top plate structure. Another copper damascene structure, used as a top plate connector structure, is then formed in the opening in the IMD layer and in the ARC shape.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
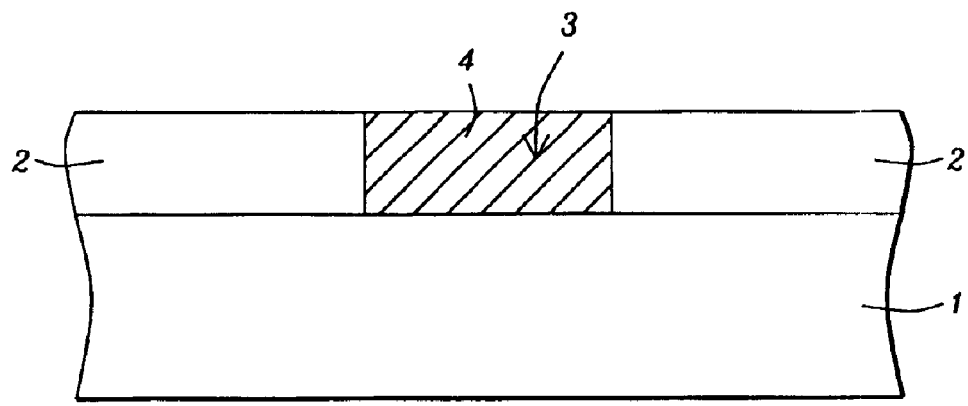
FIGS. 1–7, which schematically, in cross-sectional style describe key fabrication stages used for the formation of an MIM capacitor structure, wherein the procedures used for formation of the MIM capacitor structure are integrated into the process sequence used to form the damascene type, copper interconnect structures used for CMOS type devices.

The method used to form an MIM capacitor structure, wherein the MIM capacitor structure fabrication procedure is integrated into a process sequence used to form damascene type copper interconnect structures for CMOS type devices, will now be described in detail. Semiconductor substrate 1, shown schematically in FIG. 1, is comprised with CMOS type elements and components needed for high performance mixed signal devices and RF circuits. The specific CMOS elements (not shown in the drawings), located either in, or on semiconductor substrate 1, can be transistor structures in turn comprised with gate insulator layers, gate structures, source/drain regions, and well regions, or the specific CMOS elements can be resistor, capacitor, or underlying metal interconnect structures. Intermetallic dielectric (IMD), layer 2, comprised of a low k layer such as undoped silica glass (USG), or fluorinated silica glass (FSG), is next deposited via low pressure chemical vapor deposition (LPCVD), or via plasma enhanced chemical vapor deposition (PECVD), procedures, to a thickness between about 3,000 to 5,000 Angstroms. The dielectric constant of IMD layer 2, between about 3 to 4, will result in a minimum capacitance therefore allowing improved device performance to be obtained when compared to counterparts employing IMD layers comprised with higher dielectric constants. Photolithographic and reactive ion etching (RIE), dry etch procedure, using $CHF_3$ as an etchant for IMD layer 2, are employed to define opening 3, in IMD layer 2, exposing a portion of semiconductor substrate 1, a portion containing specific elements of underlying CMOS type components. After removal of the photoresist shape used for definition of opening 3, via plasma oxygen ashing procedures, a copper layer is deposited to a thickness between about 5,000 to 9,000 Angstroms, completely filling opening 3. The copper layer is deposited either via plasma vapor deposition (PVD), or via electroplating procedures. A chemical mechanical polishing (CMP), procedure is next used for planarization, selectively removing portions of the copper layer from the top surface of ID layer 2, resulting in copper damascene structure 4, in opening 3. Copper damascene structure 4, schematically shown in FIG. 1, will be used as a bottom plate connector structure for a MIM capacitor structure, to be subsequently formed.

Figure 2:
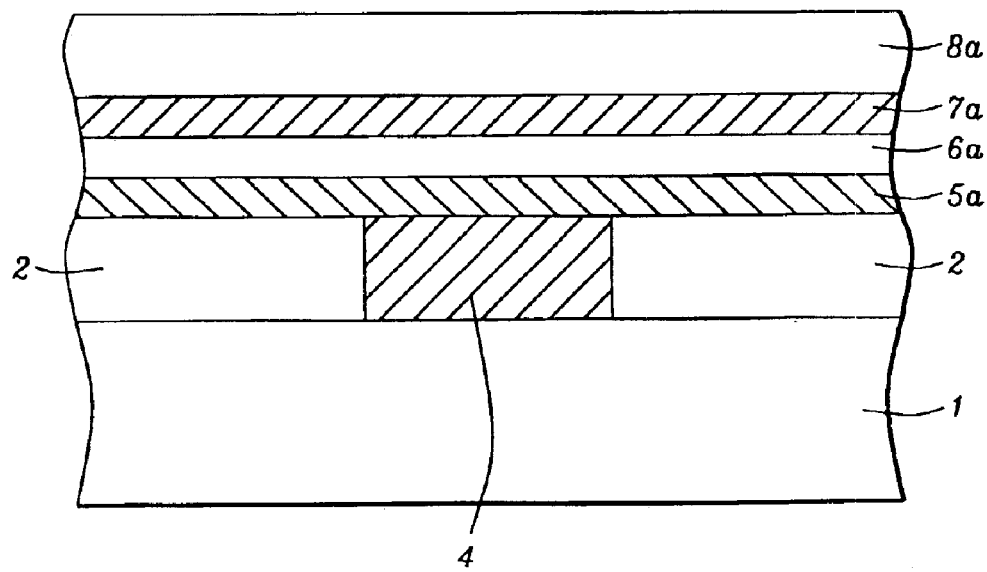

The materials needed for formation of an MIM capacitor structure are next deposited, and schematically shown in FIG. 2. Underlying conductive layer 5a, comprised of titanium nitride (TiN), or tantalum nitride (TaN), is deposited to a thickness between about 300 to 800 Angstroms, via PVD or via chemical vapor deposition (CVD), procedures. Dielectric layer 6a, comprised of silicon oxide, silicon nitride, or tantalum oxide, is next deposited via LPCVD, PECVD or PVD procedures, at a thickness between about 200 to 600 Angstroms. Overlying conductive layer 7a, again comprised of TiN or TaN, is deposited to a thickness between about 300 to 800 Angstroms, again via PVD or via chemical vapor deposition (CVD), procedures. Finally anti-reflective coating (ARC), layer 8a, comprised of silicon oxynitride, is deposited to a thickness between about 300 to 1200 Angstroms, via CVD procedures.

Figure 3:
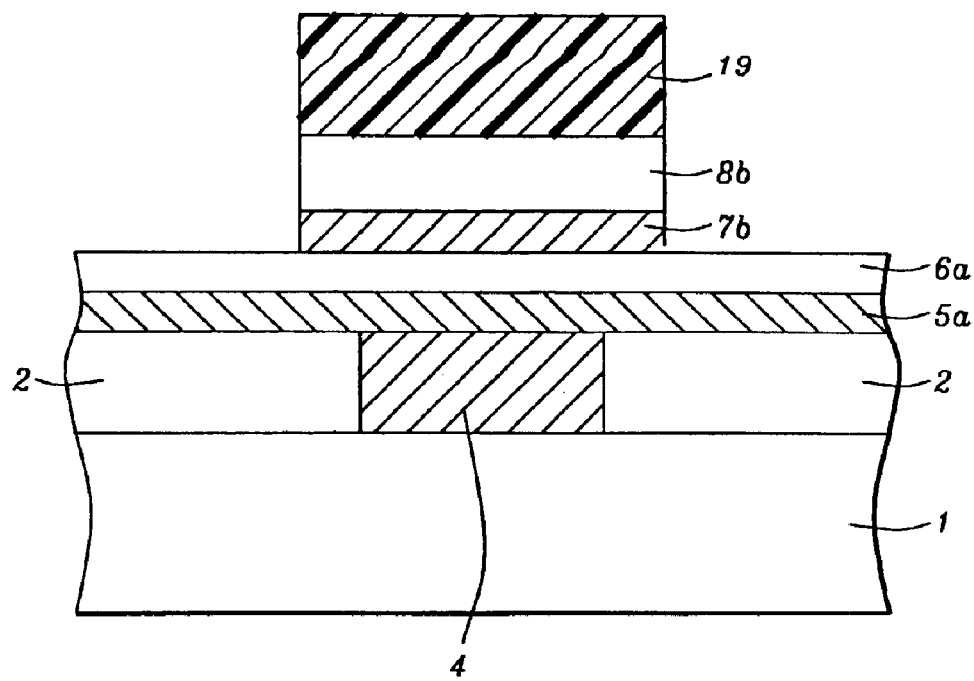
Figure 4:
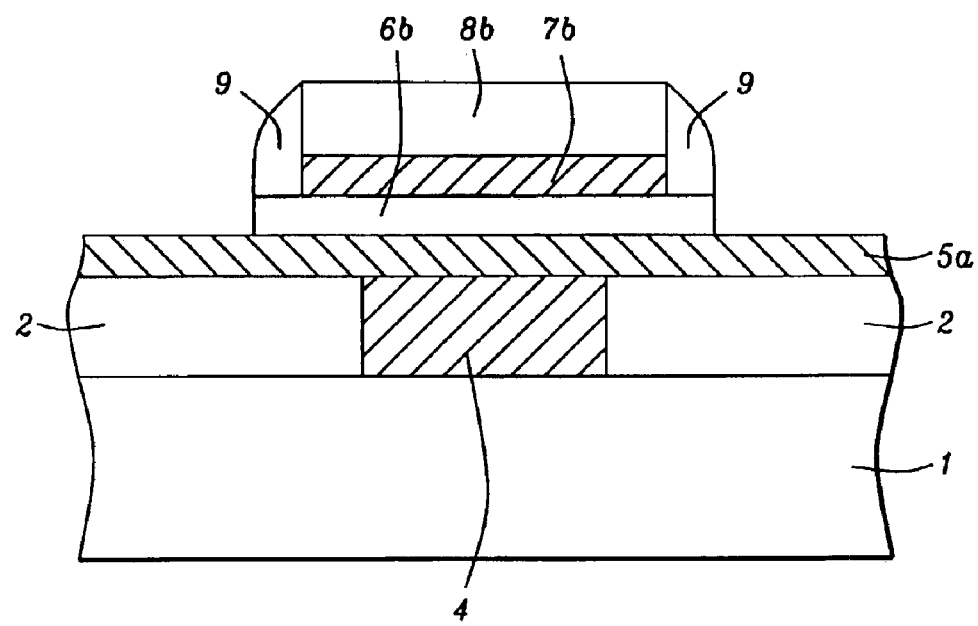
Figure 5:
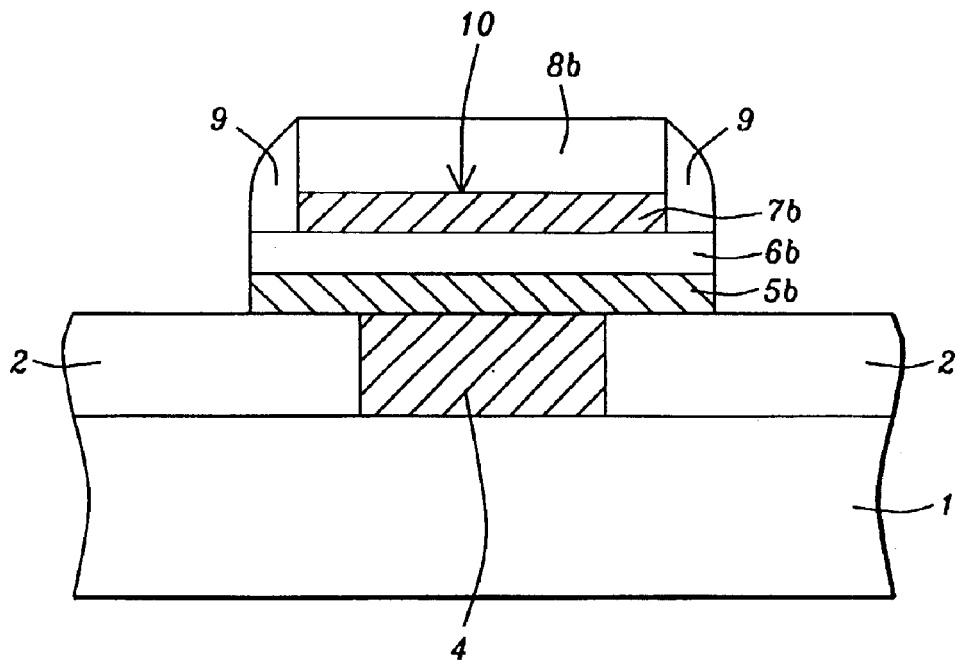

Definition of the MIM capacitor structure is next addressed and schematically illustrated using FIGS. 3–5. Photolithographic procedures are employed to form photoresist shape 9, which in turn is used as an etch mask to define ARC shape 8b, and underlying, capacitor top plate structure 7b. This is accomplished via anisotropic RIE procedures using $CF_4$ as an etchant for ARC layer 8a, while $Cl_2$ is used as a selective etchant to define capacitor top plate structure 7b, with the selective $Cl_2$ RIE procedure terminating at the appearance of the top surface of capacitor dielectric layer 6a. This is schematically shown in FIG. 3.

Photoresist shape 19, is then removed via plasma oxygen ashing procedure, followed by deposition of a silicon oxide layer, via LPCVD or PECVD procedures, to a thickness between about 500 to 1500 Angstroms. Another anisotropic RIE procedure is performed using $CHF_3$ as a selective etchant for the silicon oxide layer, resulting in the definition of silicon oxide spacers 9, on the sides of ARC shape 8b, and on the sides of capacitor top plate structure 7b. The selective etch properties of this anisotropic RIE procedure also allowed removal of exposed portions of capacitor dielectric layer to be accomplished, resulting in the definition of capacitor dielectric shape 6b, with this selective dry etch procedure terminating at the appearance of the top surface of ARC shape 8b, and at the appearance underlying conductive layer 5a. This is schematically shown in FIG. 4.

Using silicon oxide spacers 9, and ARC shape 8b, as an etch mask, an anisotropic RIE procedure is again employed to selectively etch underlying conductive layer 5a, resulting in the definition of capacitor bottom plate structure 5b. The selective, anisotropic RIE procedure allowing the definition of capacitor bottom plate structure 5b, was performed using $Cl_2$ as a selective etchant for underlying conductive layer 5a. The result of this procedure is schematically shown in FIG. 5. MIM capacitor structure 10, is now complete comprised of capacitor top plate structure 7b, capacitor dielectric shape 6b; capacitor bottom plate structure 5b, featuring overlying ARC shape 8b, and featuring silicon oxide spacer 9, located on the sides of ARC shape 8b, and on the sides of capacitor top plate structure 7b, and located overlying the edges of capacitor dielectric shape 6b.

Figure 6:
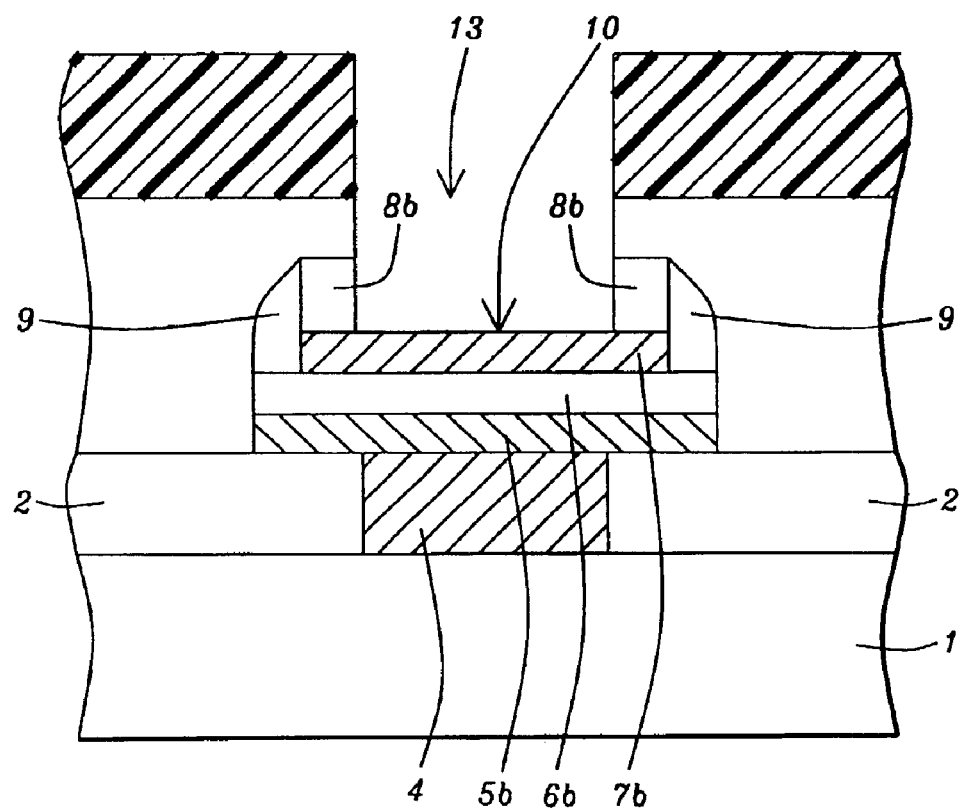
Figure 7:
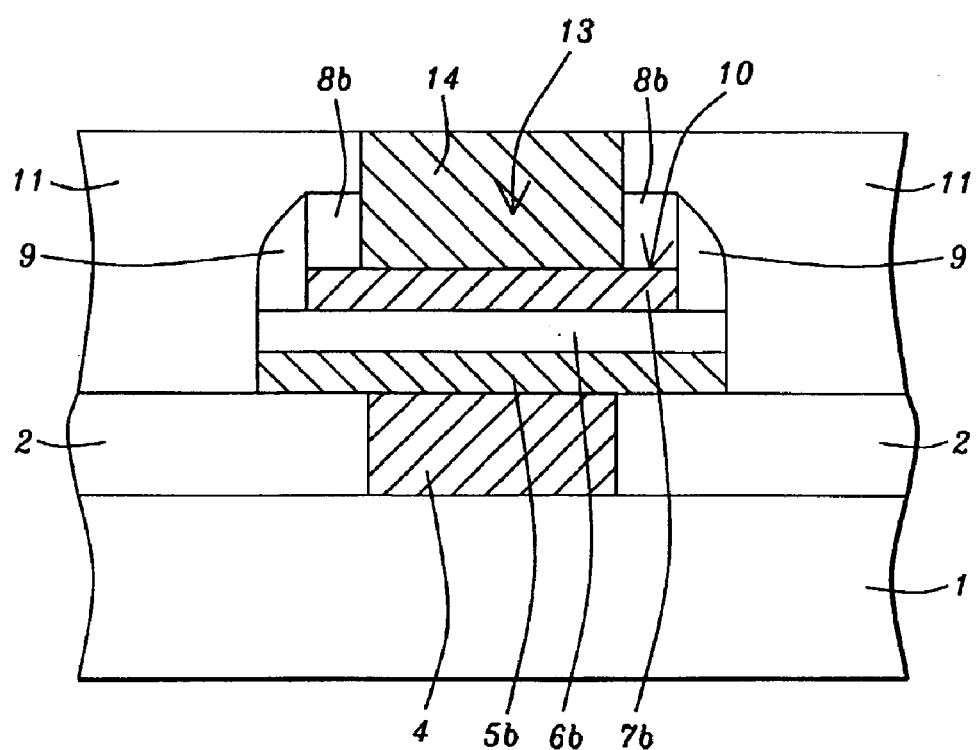

The formation of a top plate connector structure used to contact the capacitor top plate structure 7b, of MIM capacitor structure 10, is next addressed and schematically illustrated using FIG. 6–7. Intermetallic dielectric (IMD) layer 11, comprised of either undoped silica glass (USG), fluorinated silica glass (FSG), or a low k layer, is deposited to a thickness between about 6,000 to 10,000 Angstroms, via CVD, LPCVD, or PECVD procedures. After planarization of IMD layer 11, via CMP procedures, photoresist shape 12, is defined, featuring an opening which exposes a top portion of IMD layer 11. An anisotropic RIE procedure is next performed using $CF_4$ as an etchant, removing exposed portions of IMD layer 11, and portions of underlying ARC shape 8b, resulting in the definition of opening 13. The selective RIE procedure terminated at the appearance of the portion of capacitor top plate structure 7b, exposed in opening 13. This is schematically shown in FIG. 6.

After the removal of photoresist shape 12, via plasma oxygen ashing procedures, a copper layer is deposited via to a thickness between about 7,000 to 12,000 Angstroms, completely filling opening 13. The copper layer is deposited either via plasma vapor deposition (PVD), or via electroplating procedures. A chemical mechanical polishing (CMP), procedure is next used for planarization, selectively removing portions of the copper layer from the top surface of IMD layer 11, resulting in copper damascene structure 14, located in opening 13, overlying and contacting capacitor top plate structure 7b. The copper damascene structure will be used as the top plate connector structure for MIM capacitor structure 10. This is schematically shown in FIG. 7. Therefore the use of the selective, anisotropic RIE procedures, the use of silicon oxide spacers, and the use of an overlying ARC shape, allowed a fabrication sequence used to define the MIM capacitor structure to be accomplished without exposing the capacitor top structure to subsequent severe process sequences, and to be accomplished without exposing MIM components to contaminating polymer materials.

While this invention has been particularly shown and described with reference to, the preferred embodiments thereof, it will be understood by those skilled in the art that various changes in form and details may be made without departing from the spirit and scope of this invention.

What is claimed is:

1. A metal-insulator-metal (MIM), capacitor structure on a semiconductor substrate, comprising:

a first metal connector structure located in a first opening in a first intermetallic dielectric (IMD)layer, with said first metal connector structure overlying and contacting portions of underlying, said semiconductor substrate;

said MIM capacitor structure on top surface of said first IMD layer, and on top surface of said first metal connector structure, with said MIM capacitor structure comprised of an underlying capacitor bottom plate, a capacitor dielectric shape, and an overlying capacitor top plate;

an insulator shape located only on top surface of said capacitor top plate;

insulator spacers located on the sides of said insulator shape and on sides of said capacitor top plate, with said insulator spacers overlying edges of said capacitor dielectric shape;

a second ILD layer overlying said insulator shape;

a second opening in second ILD layer, and in said insulator shape, exposing a portion of the top surface of said capacitor top plate; and a second metal connector structure located in said second opening, overlying and contacting a portion of the top surface of said capacitor top plate.

2. The MIM capacitor structure of claim 1, wherein said first metal connector structure is a copper damascene structure.

3. The MIM capacitor structure of claim 1, wherein said capacitor bottom plate is comprised of titanium nitride or tantalum nitride, at a thickness between about 300 to 800 Angstroms.

4. The MIM capacitor structure of claim 1, wherein said capacitor dielectric shape is comprised of either silicon oxide, silicon nitride, or tantalum oxide, at a thickness between about 200 to 600 Angstroms.

5. The MIM capacitor structure of claim 1, wherein said capacitor top plate is comprised of titanium nitride or tantalum nitride, at a thickness between about 300 to 800 Angstroms.

6. The MIM capacitor structure of claim 1, wherein said insulator shape located on the top surface of said capacitor top plate, is comprised of silicon oxynitride at a thickness between about 300 to 1200 Angstroms.

7. The MIM capacitor structure of claim 1, wherein said insulator spacers are comprised of silicon oxide, at a thickness between about 500 to 1500 Angstroms.

8. The MIM capacitor structure of claim 1, wherein said second metal connector structure is a copper damascene structure.

* * * * *